(12) United States Patent
Goto et al.

(10) Patent No.: US 7,638,259 B2
(45) Date of Patent: Dec. 29, 2009

(54) POLYIMIDE RESIN SOLUBLE IN AQUEOUS ALKALINE SOLUTION, COMPOSITION COMPRISING THE RESIN AND CURED COATING PREPARED FROM THE COMPOSITION

(75) Inventors: Tomoyuki Goto, Annaka (JP); Michihiro Sugo, Annaka (JP); Shohei Tagami, Annaka (JP); Hideto Kato, Takasaki (JP)

(73) Assignee: Shin-Etsu Chemical Co., Ltd., Chiyoda-ku, Tokyo (JP)

( * ) Notice: Subject to any disclaimer, the term of this patent is extended or adjusted under 35 U.S.C. 154(b) by 86 days.

(21) Appl. No.: 11/892,244

(22) Filed: Aug. 21, 2007

(65) Prior Publication Data

US 2008/0057446 A1    Mar. 6, 2008

(30) Foreign Application Priority Data

Aug. 22, 2006   (JP) ............................. 2006-225434

(51) Int. Cl.
*G03F 7/04* (2006.01)
*G03F 7/30* (2006.01)
*C08G 69/48* (2006.01)

(52) U.S. Cl. ................. 430/270.1; 430/287.1; 430/326; 430/330; 430/906

(58) Field of Classification Search ............. 430/270.1, 430/906, 287.1, 326, 330; 528/353; 525/424, 525/426, 434, 435, 436
See application file for complete search history.

(56) References Cited

U.S. PATENT DOCUMENTS

| | | | |
|---|---|---|---|
| 3,953,877 A | 4/1976 | Sigusch et al. | |
| 3,957,512 A | 5/1976 | Kleeberg et al. | |
| 4,243,743 A | 1/1981 | Hiramoto et al. | |
| 4,339,521 A | 7/1982 | Ahne et al. | |
| 4,395,482 A | 7/1983 | Ahne et al. | |
| 5,114,826 A * | 5/1992 | Kwong et al. | 430/192 |
| 5,288,588 A | 2/1994 | Yukawa et al. | |
| 6,001,534 A | 12/1999 | Kato | |
| 6,096,480 A * | 8/2000 | Ishikawa et al. | 430/283.1 |
| 6,605,353 B2 | 8/2003 | Okada et al. | |
| 6,686,106 B2 | 2/2004 | Yasuno et al. | |
| 6,723,484 B1 * | 4/2004 | Tomikawa et al. | 430/192 |
| 7,485,405 B2 * | 2/2009 | Kato et al. | 430/270.1 |
| 2006/0079658 A1 * | 4/2006 | Kato et al. | 528/43 |

FOREIGN PATENT DOCUMENTS

| | | |
|---|---|---|
| JP | 49-115541 | 11/1974 |
| JP | 54-145794 A | 11/1979 |
| JP | 55-45746 A | 3/1980 |
| JP | 64-46862 A | 2/1989 |
| JP | 3-209478 A | 9/1991 |
| JP | 10-265571 A | 10/1998 |
| JP | 10-274850 A | 10/1998 |
| JP | 11-65107 A | 3/1999 |
| JP | 2000-147761 A | 5/2000 |
| JP | 2001-335619 A | 12/2001 |
| JP | 2002-351073 A | 12/2002 |
| JP | 2004-325616 A | 11/2004 |
| JP | 2006028533 | * 2/2006 |
| JP | 2006-119513 A | 5/2006 |

* cited by examiner

*Primary Examiner*—John S Chu
(74) *Attorney, Agent, or Firm*—Birch, Stewart, Kolasch & Birch, LLP

(57) ABSTRACT

A polyimide resin, characterized in that the polyimide resin comprises three kinds of repeating units represented by the formula (1), and has a weight average molecular weight, reduced to polystyrene, of from 5,000 to 500,000, an acryl equivalent of from 400 to 3,000 g/eq, and a carboxylic acid equivalent of from 300 to 2500 g/eq

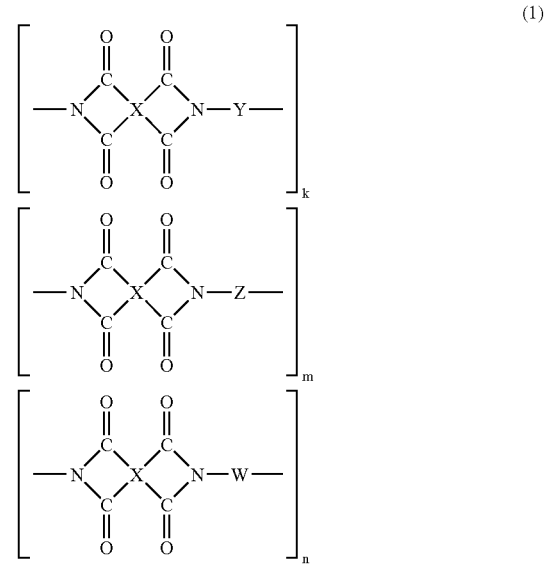

(1)

wherein X is a tetravalent organic group, Y is a divalent organic group, Z is a divalent organic group, W is a divalent organic group having a polyorganosiloxane structure. The polyimide resin is suitable for preparing a patterned or non-patterned protective coating.

11 Claims, No Drawings

POLYIMIDE RESIN SOLUBLE IN AQUEOUS ALKALINE SOLUTION, COMPOSITION COMPRISING THE RESIN AND CURED COATING PREPARED FROM THE COMPOSITION

CROSS REFERENCE

This application claims benefit of Japanese Patent application No. 2006-225434 filed on Aug. 22, 2006, the contents of which are hereby incorporated by reference.

FIELD OF THE INVENTION

The present invention relates to a photosensitive polyimide resin, specifically to a polyimide resin which has a carboxylic group in addition to a photosensitive group and is soluble in an aqueous alkaline solution. The present invention also relates to a photosensitive composition comprising the resin and to a cured coating prepared from the composition. The photosensitive composition is suitable for preparing a cover-lay film, a protective electric insulating coating for semiconductor devices and multilayer printed circuit board.

DESCRIPTION OF THE PRIOR ART

Photosensitive polyimide materials comprising precursors thereof, i.e., polyamic acids, are known. For example, Japanese Patent Application (JPA) Laid-Open No. 49-115541, and JPA Laid-Open No. 55-45746 describe polyamic acids having photosensitive groups introduced by esterifying carboxyl group, and JPA Laid-Open No. 54-145794 describes a photosensitive material comprising a polyamic acid and amine compound having a photosensitive group. These materials need to be imidized at a temperature above 300° C., after applied and patterned on a substrate, to from a polyimide film. This requires a substrate resistant to such high temperature and tends to oxidize copper circuit lines provided on the substrate.

To avoid the imidization at a high temperature, photosensitive polyimide resins which have already been imidized are known from JPA Laid-Open No. 10-274850, JPA Laid-Open No. 10-265571, and JPA Laid-Open No. 2001-335619. All of the polyimide resins have (meth)acryl group as a photosensitive group. Compositions comprising these resins can be developed with an organic solvent. From the environmental and safety view point, an aqueous alkaline solution is preferable to the organic solvent. However, these resins are hardly developed with an aqueous alkaline solution or, even if developed, only with a very strong alkaline solution.

Polyimide resins which can be developed with an aqueous alkaline solution are known. For example, a polyimide resin having phenolic hydroxyl groups is known from JPA Laid-Open No. 3-209478, and a positive photoresist composition comprising a polyimide and diazonaphthoquinone is known from Japanese Patent Publication of Examined Application No. 1-46862 and JPA Laid-Open No. 11-65107. These resins, however, have optical transmittance too low to make a cured film having a thickness larger than 10 μm. In addition, a cured film lacks mechanical strength for the reasons that the polyimide resin has relative low molecular weight and relatively large amount of diazonaphthoquinone per polyimide molecule is contained in order to secure development property.

SUMMARY OF THE INVENTION

An object of the present invention it to provide a photosensitive polyimide resin which can be imidized at a relatively low temperature, developed with an aqueous alkaline solution to form a coating having strongly adhered to a substrate. Other objects of the present invention are to provide a composition comprising the polyimide resin and a cured coating prepared from the composition.

The present inventors have found that a photosensitive composition comprising a polyimide resin having both (meth)acryl and carboxyl groups can be developed well with an alkaline solution. A cured coating prepared from the composition is excellent in heat resistance and electrical insulation property.

The present invention is a polyimide resin, characterized in that the polyimide resin comprises three kinds of repeating units represented by the formula (1), and has a weight average molecular weight, reduced to polystyrene, of from 5,000 to 500,000, an acryl equivalent of from 400 to 3,000 g/eq, and a carboxylic acid equivalent of from 300 to 2500 g/eq.

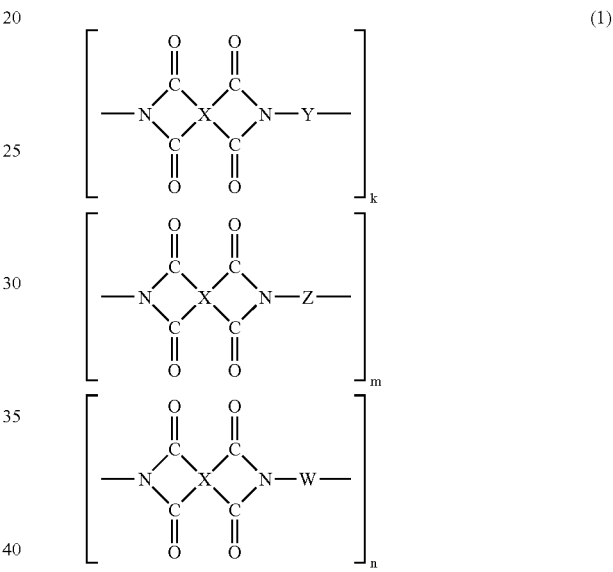

wherein X is a tetravalent organic group, Y is a divalent organic group having at least one selected from the group consisting of (meth)acryl, carboxyl, and hydroxyl groups, Z is a divalent organic group which does not have any of (meth)acryl, carboxyl, and hydroxyl groups, W is a divalent organic group having a polyorganosiloxane structure, and X, Y, Z and W each may be a mixture of two or more groups, k is a number of from 0.2 to 1.0, m is a number of from 0 to 0.8, and n is a number of from 0 to 0.8, with k+m+n being 1.

A pattern made from the above polyimide resin of the present invention can be developed well with an aqueous solution of a weak alkaline such as sodium carbonate. A developed patterned layer strongly adherers to a substrate and has good electrical properties. Therefore, the present polyimide resin is suitable for preparing a patterned protective coating for semiconductor devices and wirings, a cover-lay film, and as a solder resist.

DESCRIPTION OF THE PREFERRED EMBODIMENTS

The present polyimide resin has a weight average molecular weight, reduced to polystyrene, of from 5,000 to 500,000, preferably from 10,000 to 300,000. If a weight average molecular weight is smaller than the aforesaid lower limit, a cured coating having satisfactory mechanical strength may not be obtained. A polyimide resin having a weight average molecular weight above the aforesaid upper limit may not be readily soluble in organic solvents.

The present invention is a block or random copolymer of the three kinds of repeating units represented by the formula (1):

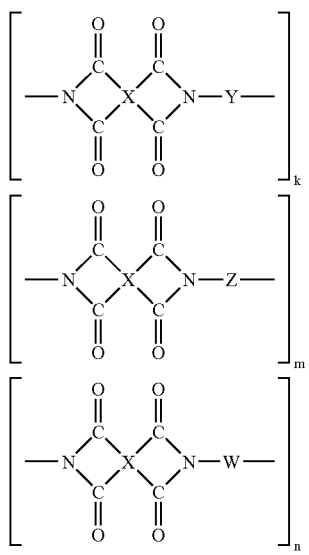

wherein X is a tetravalent organic group and can be derived from a tetracarboxylic acid dianhydride. Y is a divalent organic group having at least one selected from the group consisting of (meth)acryl, carboxyl, and hydroxyl groups. Z is a divalent organic group which does not have any of (meth)acryl, carboxyl, and hydroxyl groups, W is a divalent organic group having a polyorganosiloxane structure, and X, Y, Z and W each may be a mixture of two or more groups.

In the formula (1), k is the number of from 0.2 to 1.0, m is the number of from 0 to 0.8, and n is the number of from 0 to 0.8, with k+m+n being 1. Preferably, k is the number of from 0.4 to 1.0, m is the number of from 0 to 0.4, and n is the number of from 0 to 0.4.

The polyimide resin of the present invention has an acryl equivalent of from 400 to 3,000 g/eq, preferably from 400 to 2,000 g/eq, most preferably from 400 to 1,800 g/eq, and a carboxylic acid equivalent of from 300 to 2500 g/eq, preferably from 300 to 1,500 g/eq, most preferably from 300 to 1,000 g/eq. In the present invention, an acryl equivalent is a calculated theoretical weight per molar (meth)acryl group. A carboxylic acid equivalent is a weight per molar carboxylic group and is determined by adding an aliquot of an alkaline solution to the polyimide resin and then back titrating an excess amount of the alkaline with an acid. If an acryl equivalent exceeds the aforesaid upper limit, a desired photosensitivity may not be attained. If a carboxylic acid equivalent exceeds the aforesaid upper limit, development property may not be good. If an acryl or a carboxylic acid equivalent is blow the aforesaid lower limit, a cured coating may not have satisfactory mechanical strength.

In the formula (1), preferred X is at least one tetracarboxylic acid dianhydride residue selected from the followings:

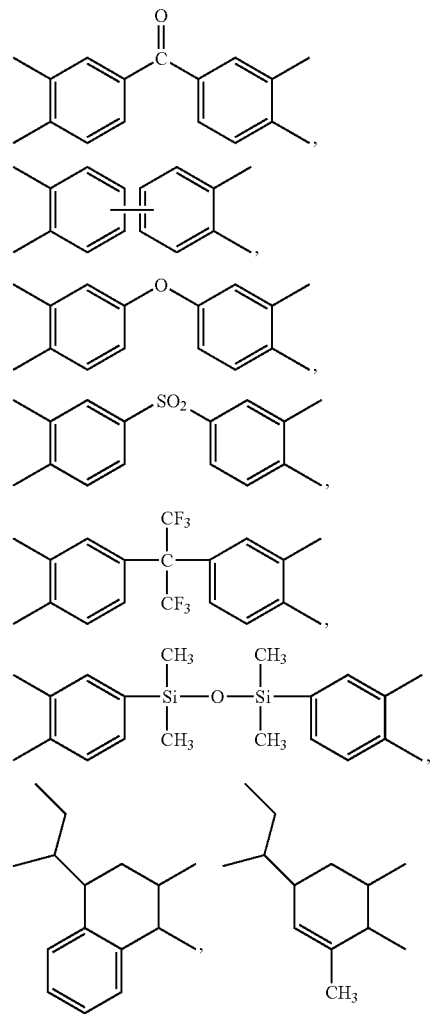

In the formula (1), preferred Y is represented by the following formula (3):

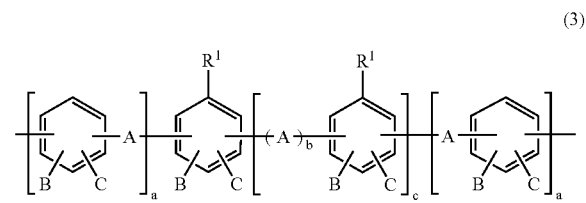

wherein A may be the same with or different from each other and is a divalent organic group selected from the following groups;

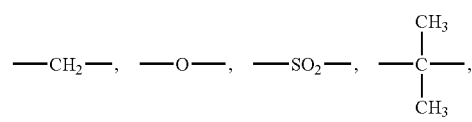

-continued

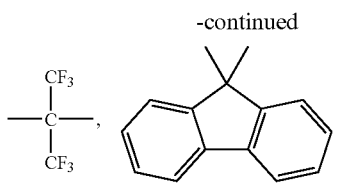

B and C may be the same with or different from each other and are $C_{1-4}$ alkyl groups, alkoxy groups or hydrogen atoms, each of a and b is 0 or 1, and c is an integer of from 0 to 10.

$R^1$ may be the same with or different from each other and is selected from the following groups;

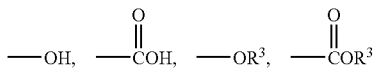

wherein $R^3$ is a monovalent $C_{3-34}$ group which has at least one selected from the group consisting of (meth)acryl group, carboxyl, and hydroxyl groups and may have an oxygen and/or nitrogen atom.

Preferably, $R^3$ is represented by the following formula

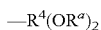

wherein $R^4$ is a trivalent hydrocarbon group having 3 to 6 carbon atoms, and $R^a$ may be different from each other and is selected from the group consisting of a hydrogen atom, $C_{6-14}$ (meth)acryloyloxy isocyanate residue, and $C_{4-14}$ acid anhydride residue.

Preferred (meth)acryloyloxy isocyanate residue and acid anhydride residue are as shown below.

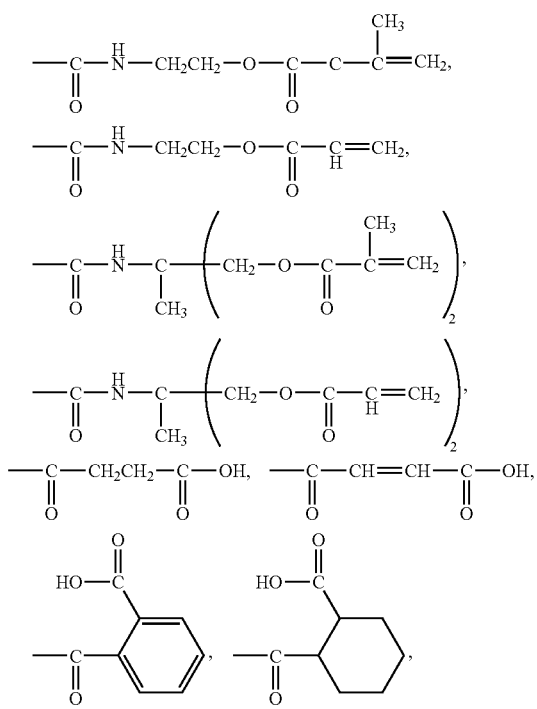

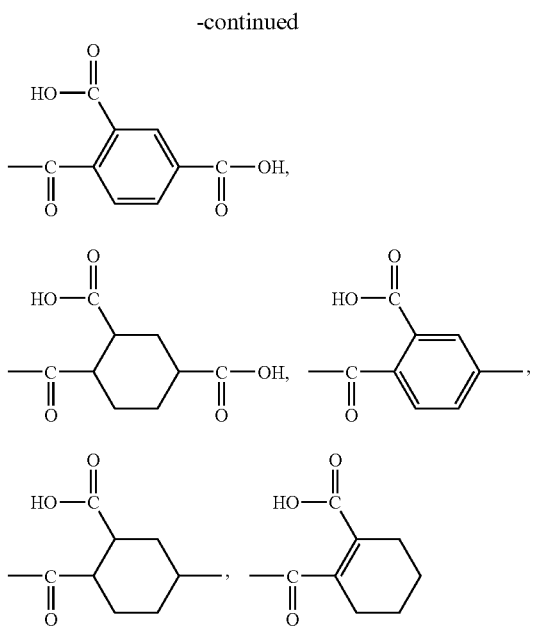

Examples of the preferred $R^4$ are as shown below:

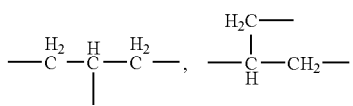

wherein each bond is bound to an oxygen atom.

Z is a divalent organic group represented by the following formula (4):

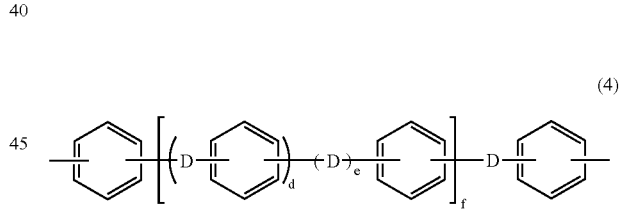
(4)

wherein D may be the same with or different from each other and is a divalent organic group selected from the following groups.

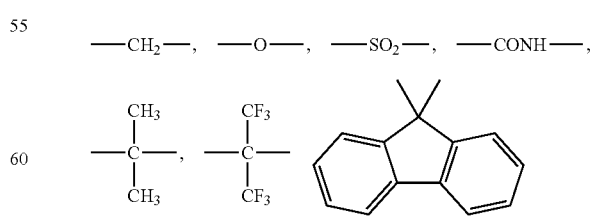

In the formula (4), d, e and f each are 0 or 1.

W is a divalent organic group which has a polyorganosiloxane structure represented by the following formula (5):

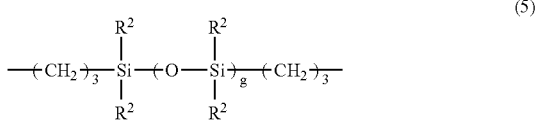

(5)

wherein $R^2$ may be the same with and different from each other and is a $C_{1-8}$ monovalent hydrocarbon group. Examples of $R^2$ include alkyl groups such as methyl, ethyl, propyl, butyl, pentyl and hexyl groups; cycloalkyl groups such as cyclopentyl and cyclohexyl groups; aryl groups such as a phenyl group; aralkyl groups such as benzyl and phenetyl groups; alkenyl groups such as vinyl, allyl, propenyl, isopropenyl and butenyl groups; acryl and methacryl groups. Among these, methyl, ethyl, phenyl and vinyl groups are preferred due to good availability of raw materials. In the formula (5), g is an integer of from 1 to 80, preferably from 3 to 70, more preferably from 5 to 50.

The repeating unit comprising Y can be prepared by the following manner. Firstly, a diamine with $R^1$ being a phenolic hydroxyl group or a carboxyl group and a tetracarboxylic acid to derive the aforesaid X are subjected to a condensation reaction in an appropriate organic solvent according to a conventional method.

A polyamic acid solution thus obtained is heated at a temperature of 100° C. or higher to remove water formed by dehydration reaction, whereby a solution of polyimide resin having a phenolic hydroxyl or carboxyl group is obtained.

To the solution of the polyimide resin, a predetermined amount of a compound having a group reactive with a phenolic hydroxyl group or carboxyl group, such as glycidyl group, preferably glycidol, is added and heated at a temperature of about 150° C. to prepare a solution of a polyimide resin having an alcoholic hydroxyl group. To the solution, a predetermined amount of a compound which has a functional group reactive with an alcoholic hydroxyl group, such as glycidyl group, isocyanate group, halogen atom, preferably a compound having both isocyanate group and a (meth)acryl group, such as 2-methacryloyloxy isocyanate or 2-acryloyloxyisocyanate, is then added and heated at a temperature of 60° C. or lower to prepare a polyimide resin having a methacryl or acryl group.

By adding an amount of an acid anhydride such as hexahydroxyphthalic acid anhydride in place of or in addition to the aforesaid compound having a (meth)acryl group and heating at a temperature raging from 50 to 70° C., a polyimide resin having Y containing a carboxyl group can be obtained.

The repeating unit containing Z or W can be prepared by reacting a diamine having amino groups at both ends with a carboxylic acid dianhydride to derive X.

The present invention also present a photosensitive resin composition comprising the aforesaid polyimide resin, hereinafter referred to as the polyimide resin (A). The composition also comprises (B) a photopolymerization initiator and/or photosensitizer.

The photopolymerization initiator and/or photosensitizer (B) generate a radical to initiate polymerization or promote polymerization. Examples of the photopolymerization initiator include benzoin isopropyl ether, 2-methyl-[4-(methylthio)phenyl]-2-morpholino-1-propanone, 1-phenyl-1,2-butanedione-2-(o-methoxycarbonyl)oxime, N-phenylglycine and 3-phenyl-5-isoxazolone.

Example of the sensitizer include ethyl 4-diethylaminoenzoate, benzophenone, acetophenone, anthrone, phenanthrene, nitrofluorene, nitroacenaphthene, p,p'-tetramethyldiaminobenzophenone, p,p'-tetraethyldiaminobenzophenone, chlorothioxanthone, benzanthraquinone, 2,6-bis(4-diethylaminobenzal)-cyclohexanone, 2,6-bis(4-diethylaminobenzal)-4-methylcyclohexanone, 4,4,'-bis(diethylamino)chalcone, 2,4-diethylthioxanthone, N-phenyl-diethanolamine, diethylaminoethyl methacrylate, coumarin compound benzyl [e.g., carbonylbis (diethylaminocoumarin)], benzoin isopropyl ether, 1-hydroxycyclohexyl phenyl ketone, camphorquinone, and biimidazoles [e.g., 2,2'-bis(o-chlorophenyl)-4,5,4',5'-tetraphenyl-1,2'-biimidazole].

These initiator and sensitizer can be used alone or a mixture of two or more of them.

The component (B) is contained in the composition in an amount of from 0.1 to 20 parts by weight, preferably from 0.5 to 15 parts by weight, more preferably from 0.5 to 10 parts by weight per total 100 parts by weight of the components (A) and (B). A composition containing the component (B) in an amount less than the aforesaid lower limit may not be sufficiently cured. On the hand, a composition containing the component (B) in an amount above the aforesaid upper limit may not be photopolymerized well or have worse storage stability.

The photosensitive resin composition of the present invention may further comprise (C) an organic solvent. Preferred organic solvents are those in which the polyimide resin (A) and the photopolymerization initiator (B) are soluble. Examples of the organic solvent include ketones such as cyclohexanone, cyclopentanone, methyl-2-n-amylketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether (diglyme); and esters such as propylene glycol monomethyl ether acetate, propylene glycol monoethyl ether acetate, ethyl lactate, ethyl pyruvate, butyl acetate, methyl 3-methoxypropionate and ethyl 3-ethoxypropionate, t-butyl acetate, t-butyl propionate, propylene glycol-mono-t-butyl ether acetate, and γ-butyrolactone; amides such as N-methyl-2-pyrollidone and N,N-dimethylacetoamide; and a mixture of two or more of these.

Among these solvents, ethyl lactate, cyclohexanone, cyclopentanone, γ-butyrolactone, N,N-dimethylacetoamide, propylene glycol monomethyl ether, propylene glycol monomethyl ether acetate and a mixture thereof are preferred.

The organic solvent (C) is used in an amount of from 50 to 2,000 parts by weight, preferably from 100 to 1,000 parts by weight, per 100 parts by weight of total solid components, that is, the components (A) and (B). Less than 50 parts by weight of the solvent may not be enough to dissolve the components (A) and (B). On the other hand, a composition comprising more than 2,000 parts by weight of the solvent tends to have a viscosity too low to apply to a substrate.

The present photosensitive composition may further comprise, in order to have improved photosensitivity, a monomer or an oligomer which can crosslink. Examples of the monomer or oligomer include 1,6-hexanediol acrylate, neopentylglycol diacrylate, ethylene glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentylglycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxy diethylene glycol methacrylate, methoxy polyethylene glycol methacrylate, β-methacryloyloxyethylhydrogen phthalate, β-methacryloyloxyethylhydrogen succinate, 3-chloro-2-hydroxypropyl methacrylate, stearyl methacrylate, phenoxyethyl acrylate, phenoxy diethylene glycol acrylate, phenoxy polyethylene glycol acrylate, β-acryloyloxyethylhydrogen succinate, lauryl acrylate, ethylene glycol dimethacrylate, fiethylene glycol dimethacrylate, triethylene glycol dimethacrylate, polyethylene glycol dimethacrylate, 1,3-butylene glycol methacrylate, polypropylene glycol dimethacrylate, 2-hydroxy-1,3-dimethacryloxy propane, 2,2-bis[4-(methacryloxy ethoxy) phenyl] propane, 2,2-bis[4-(methacryloxy diethoxy) phenyl] propane, 2,2-bis[4-(methacryloxy polyethoxy) phenyl] propane, polyethylene glycol diacrylate, tripolyethylene glycol diacrylate, polypropylene glycolacrylate, 2,2-bis[4-(acryloxy diethoxy) phenyl] propane, 2,2-bis[4-(acryloxy polyethoxy) phenyl] propane, 2-hydroxy-1-acryloxy-3-methacryloxy propane, trimethylolpropane trimethacrylate, tetramethylolmethane triacrylate, tetramethylolmethane tetraacrylate, methoxy dipropylene glycol methacrylate, methoxy triethylene glycol acrylate, nonylphenoxy polyethylene glycol acrylate, nonylphenoxy polypropylene glycol acrylate, 1-acryloyloxypropyl-2-phthalate, isostearyl acrylate, polyoxyethylene alkyl ether acrylate, nonylphenoxy ethylene glycol acrylate, polypropylene glycol dimethacrylate, 1,4-butanediol methacrylate, 3-methyl-1,5-pentanediol dimethacrylate, 1,6-hexanediol dimethacrylate, 1,9-nonanediol methacrylate, 2,4-diehtyl-1,5-pentanediol dimethacrylate, 1,4-cyclohexanediol dimethacrylate, dipropylene glycol diacrylate, tricyclodecanedimethanol diacrylate, 2,2-bis[4-(acryloxy polyethoxy) cyclohexyl] propane, 2,2-bis[4-(acryloxy polypropoxy)phenyl]propane, 2,4-diethyl-1,5-pentanediol diacrylate, ethoxylated trimethylolpropane triacrylate, propoxylated trimethylolpropane triacrylate, isocyanuric acid tri(ethane acrylate), pentaerythritol tetraacrylate, ethoxylated pentaerythritol tetraacrylate, propoxylated pentaerythritol tetraacrylate, ditrimethylolpropane tetraacrylate, and dipentaerythritol polyacrylate, among which those having two or more functionalities are preferred.

The monomer or oligomer is preferably incorporated in an amount of from 0.5 to 100 parts by weight, more preferably from 1 to 50 parts by weight per 100 parts by weight of the polyimide resin. If incorporated less than the aforesaid lower limit, improvement in photosensitivity can be hardly attained. If incorporated more than the aforesaid upper limit, the monomer or oligomer may adversely affect mechanical properties of a coating obtained from the polyimide resin, and development property of the composition. The monomer or oligomer may used in a mixture of two or more of them.

The composition may further comprise any additive commonly incorporated in a photoresist composition in an amount not to adversely affect the properties of the composition. An example of the additives is a surfactant, preferably nonionic surfactant, e.g., a fluorinated surfactant such as perfluoroalkyl polyoxyethylene ethanol, fluorinated alkyl ester, perfluoroalkylamine oxide, and fluorinated organosiloxanes.

The fluorinated surfactants are commercially available, for example, Florard FC-4430 from Sumitomo 3M Ltd., Surflon S-141, S-145, both from Asahi Glass Co.Ltd., Unidine DS-401, DS-4031, and DS-451, all from Daikin Industries Ltd., Megafak F-8151 from Dainippon Ink & Chemicals, Inc., and X-70-093 from Shin-Etsu Chemical Co.Ltd, among which Florard FC-4430 and X-70-093 are preferred.

A silane coupling agent, e.g., an epoxy silane coupling agent such as the one sold under the trade name of KMB-403 from Shin-Etsu Chemical Co., Ltd., an acrylic silane coupling agent such as the one sold under the trade name of KBM-503 from Shin-Etsu Chemical Co., Ltd., and an amino silane coupling agent such as the one sold under the trade name of KBM-903 from Shin-Etsu Chemical Co., Ltd., may be incorporated in the composition to improve adhesion of a heat cured film to a substrate. In addition, other optional additives commonly used for a photoresist can be incorporated in the composition in an amount not to adversely affect the properties of the composition.

The present photosensitive composition can be prepared by mixing the aforesaid components, an organic solvent if needed, and optional additives and then filtering the mixture, if desired.

The present composition thus prepared is suitable for protective coatings for semiconductor devices and wirings, a cover-lay film, a solder resist, and a photoresist for making a fine circuit pattern.

The present invention also provides a method of preparing a patterned layer of the aforesaid composition comprising the steps of:

(i) applying the photosensitive resin composition of the present invention on a substrate to from a layer of the photosensitive resin composition, (ii) exposing the layer of the photosensitive resin composition to a light having a wavelength of from 240 to 500 nm through a photomask having a pattern, and (iii) developing a patterned layer of the photosensitive resin composition with a developing liquid.

Between the steps (ii) and (iii), there may be a step of baking the layer of the photosensitive composition, so-called post-exposure bake (PEB) step. After the developing step (iii), (iv) post-curing or baking the patterned layer is performed, whereby an intended relief pattern is formed.

In the aforesaid method, the photosensitive resin composition is applied on a substrate. Examples of the substrate include a silicon wafer and printed wiring boards comprising plastic or ceramic board. A solution of the composition may be formed in a film which is then transferred to the substrate. Any known method of applying a coating composition may be used such as dipping, spin coating or roll coating. An amount of the composition to be applied varies depending on an intended use. Typically, the amount is such that a thickness of the applied composition layer ranges from 0.1 to 100 µm. Before the step (ii), the layer may be prebaked to evaporate a solvent in order for efficient photopolymerization. The prebaking may be performed at a temperature of from 40 to 140° C. for 1 minute to 1 hour.

Then, the layer is exposed to a light having a wavelength of from 240 to 500 nm through a photomask having a pattern to be cured. The photomask may be a patterned stencil. The photomask is preferably made of a material shielding the light having a wavelength of from 240 to 500 nm such as chromium. The light source may be ultra violet light such as g-line or i-line, and far ultra violet light of a wavelength of 248 nm. Exposure preferably ranges from 10 to 3,000 mJ/cm$^2$.

Optionally, post-exposure baking (PEB) may be performed at a temperature of from 40 to 150° C. for 0.5 minute to 10 minutes. After exposing or the post-exposure baking, developing with a developing liquid is performed. The developing liquid can be a commonly used one such as tetramethylammonium hydroxide aqueous solution, sodium carbonate aqueous solution, or an aqueous solution of basic compound. Examples of the basic compound include hydroxide or carbonate of alkali metals, alkali earth metals, ammonia, and amine compounds such as 2-dimethylaminoethanol, 3-dimethylamino-1-propanol, 4-dimethylamino-1-butanol, 5-dimethylaminol-pentanol, 6-dimethylamino-1-hexanol, 2-dimethylamino-2-methyl-1-propanol, 3-dimethylamino-2,2-dimethyl-1-propanol, 2-diethylaminoethanol, 3-diethylamino-1-propanol, 2-diisopropylaminoethanol, 2-di-n-butylaminoethanol, N,N-dibenzyl-2-aminoethanol, 2-(2-dimethylaminoethoxy)ethanol, 2-(2-diethylaminoethoxy)ethanol, 1-dimethylamino-2-propanol, 1-diethylamino-2-propanol, N-methyldiethanolamine, N-ethyldiethanolamine, N-n-butyldiethanolamine, N-t-butyldiethanolamine, N-lauryldiethanolamine, 3-diethylamino-1,2-propanediol, triethanolamine, triisopropanolamine, N-methylethanolamine, N-ethylethanolamine, N-n-butylethanolamine, N-t-butylethanolamine, diethanolamine, diisopropanolamine, 2-aminoethanol, 3-amino-1-propanol, 4-amino-1-butanol, 6-amino-1-hexanol, 1-amino-2-propanol, 2-amino-2,2-dimethyl-1-propanol, 1-aminobutanol, 2-amino-1-butanol, N-(2-aminoethyl)ethanolamine, 2-amino-2-methyl-1,3-propanediol, 2-amino-2-ethyl-1,3-propanediol, 3-amino-1,2-propanediol, 2-amino-2-hydroxymethyl-1,3-propanediol, sodium hydroxide, potassium hydroxide, ammonium hydroxide, sodium carbonate, potassium carbonate, ammonium carbonate, sodium hydrogen carbonate, potassium hydrogen carbonate, ammonium hydrogen carbonate, tetramethylammonium hydroxide, tetraethylammonium hydroxide, tetrapropylammonium hydroxide, tetraisopropylammonium hydroxide, aminomethanol, 2-aminoethanol, 3-aminopropanol, 2-aminopropanol, methylamine, ethylamine, propylamine, isopropylamine, dimethylamine, diehtylamine, dipropylamine, diisopropylamine, trimethylamine, triethylamine, tripropylamine, and triisopropylamine.

A concentration of the basic compound usually ranges from 0.1 to 30 wt %, preferably from 0.1 to 15 wt %, from the viewpoint of little damage on a substrate.

In place of an aqueous solution, an alcoholic solution such as a methanol or ethanol solution, or a solution of an organic solvent may be used. A mixture of two or more or organic solvents may be used, for example, a mixture of good and poor solvents of the photosensitive resin composition.

Developing can be performed by a commonly used method such as dipping a substrate with the photosensitive layer formed thereon in a developing liquid. Then, the substrate is washed, rinsed and dried, whereby a relief pattern of the cured composition is obtained.

A cured layer without patterned can be prepared in the same manner as described above except that the step (ii) is performed without using a photomask.

The patterned layer thus obtained may be subjected to post-baking which may be performed at a temperature of from 120 to 300° C. for a period of time of from 10 minutes to 10 hours in an oven or on a hotplate in order to increase crosslinking density and/or removal of residual solvent, resulting in improved adhesion to a substrate, heat resistance, mechanical strength and/or electrical properties.

The cured coating of the photosensitive resin composition of the present invention thus obtained has excellent adhesion to a substrate, heat resistance and electrical insulation property, so that the present composition is suitable for a protective coating for electric or electrical devices and semiconductor devices.

EXAMPLES

The present invention will be explained with reference to the following Examples, but not limited thereto.

Preparation Example I

In a flask equipped with a stirrer, a thermometer, nitrogen purge equipment, and an ester adapter, 57.9 g of 2,2'-bis(3-amino-4-hydoxyphenyl)propane and 500.0 g of N,N-dimethylacetamide as a solvent were placed and mixed. To the solution obtained, 69.5 g of 4,4'-oxydiphthalic dianhydride was added and stirred for 10 hours. To the reaction mixture solution thus obtained, 100.0 g of toluene was added and heated at 150° C. for 6 hours while recovering 8.0 g of water via the ester adapter. Then, the reaction mixture was cooled to room temperature and 660.0 g (a solid content of 17.5%) of a solution of a polyimide resin composed of the repeating unit of the following formula (I-1) was obtained.

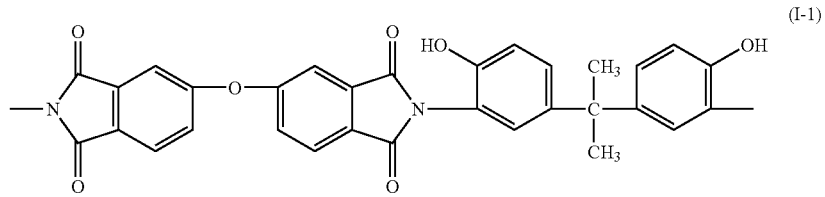

(I-1)

In an IR absorption spectrum of the resin, are observed absorption bands at 1780 cm$^{-1}$ and 1720 cm$^{-1}$ both assigned to imide groups and the one around 3400 cm$^{-1}$ assigned to OH group, and no absorption band of polyamic acid was observed.

In a flask, 200 g of the resin solution containing about 17.5% of the resin (I-1), 7.5 g of glycidol were placed and subjected to a reaction at 150° C. for 5 hours. Then, the reaction mixture was cooled to room temperature and poured in 2-liters of pure water. The precipitate obtained was vacuum dried at 35° C. whereby 34 g of the resin was obtained. In H-NMR analysis of the resin, it was observed that a peak intensity of a phenolic OH group at 10.1 ppm was about 30% of that of the original resin(I-1), and there were peaks at 4.6 ppm and 4.8 ppm assigned to a primary alcoholic OH and a secondary alcoholic OH, respectively. The resin therefore was determined to have the following structure (I-2):

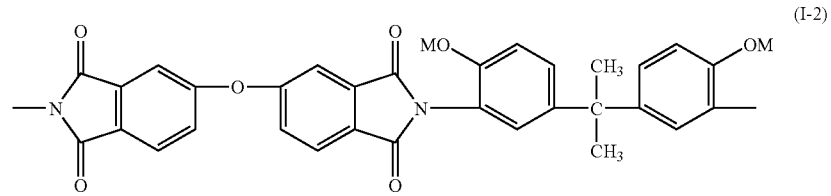

(I-2)

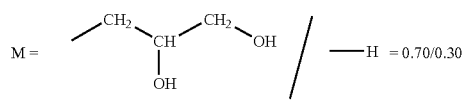

wherein 70% of M is a group derived from glycidol and 30% of M is hydrogen atom. From the H-NMR spectrum, primary alcoholic OH equivalent was determined to be 450 g/eq. The resin was found to have a weight average molecular weight, reduced to polystyrene, of 38,000 by gel permeation chromatography using tetrahydrofuran as a solvent.

In a flask, 30 g of the resin (I-2) and 270 g of N,N-dimethylacetamide were placed and heated at 60° C., to which 6.1 g of methacryloyloxyethyl isocyanate sold under the trade name of Krenz MOI, ex Showa Denko K.K., was added dropwise followed by stirring for 1 hours. While heating the reaction mixture at 60° C., 14.2 g of hexahydrophthalic acid anhydride was added and stirred for 4 hours, whereby 310 g (a solid content of 16.1%) of a solution of the polyimide resin represented by the following formula (I-3) was obtained.

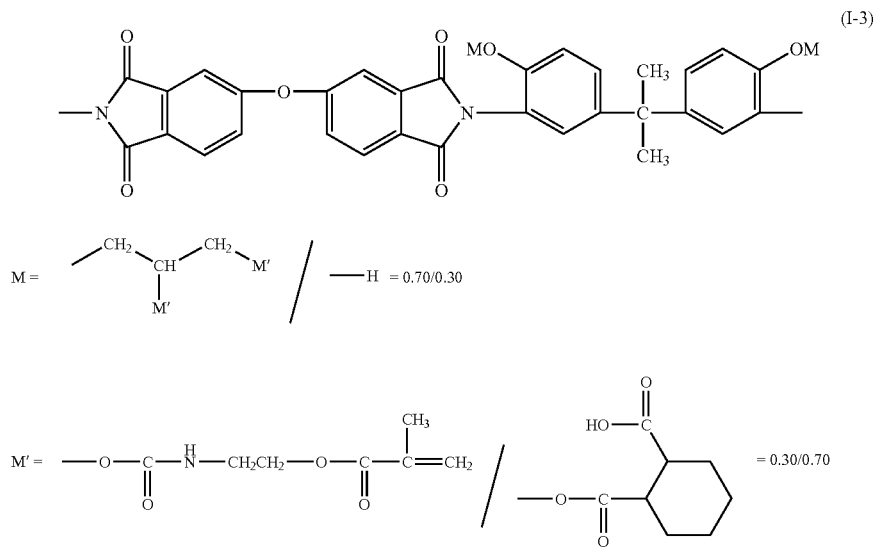

The polyimide resin was found to have a weight average molecular weight of 63,000, a carboxylic acid equivalent of 540 and an acryl equivalent of 1,300.

Preparation Example II

The procedures of Preparation Example I were repeated except that 8.1 g of methacryloyloxyethyl isocyanate and 12.2 g of hexahydrophthalic acid anhydride were reacted with 30 g of the resin(I-2) to obtain 310 g (a solid content of 16.1%) of a solution of the polyimide resin of the following formula (II-3).

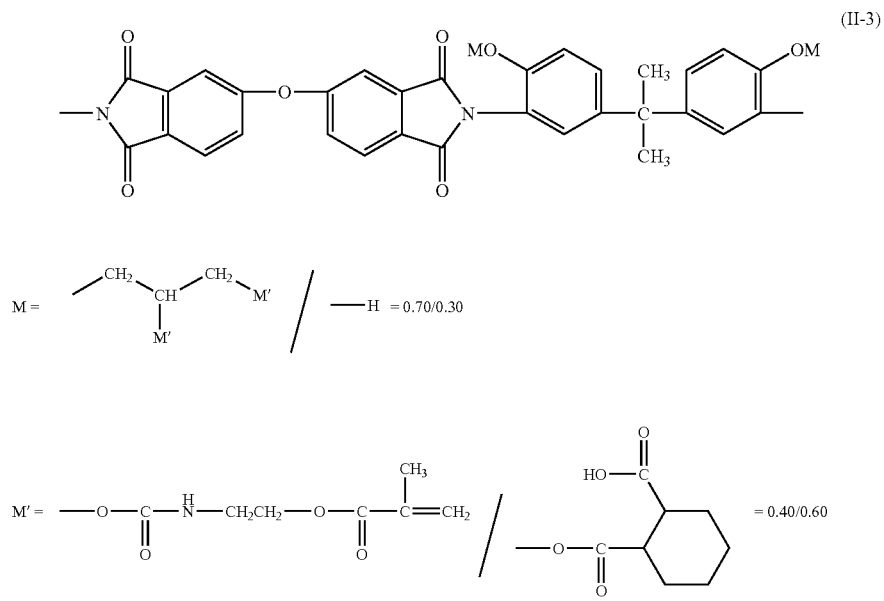

The resin had a weight average molecular weight of 62,000, an acryl equivalent of 950 g/eq, and a carboxylic acid equivalent of 630.

Preparation Example III

The procedures of Preparation Example I were repeated except that 31.0 g of 4,4'-oxydiphthalic dianhydride, 20.5 g of 2,2'-bis(3-amino-4-hydoxyphenyl)propane, 4.1 g of 2,2'-bis(4-amino-4-hydoxyphenyl)propane, and 2.5 g of diaminopolydimethylsiloxane represented by the aforesaid formula (5) with g being 9, 240.0 g of N,N-dimethylacetamide as a solvent, and 50.0 g of toluene were used to obtain 300 g(a solid content of 18.2%) of a solution of the polyimide resin having phenol groups represented by the following formula(III-1).

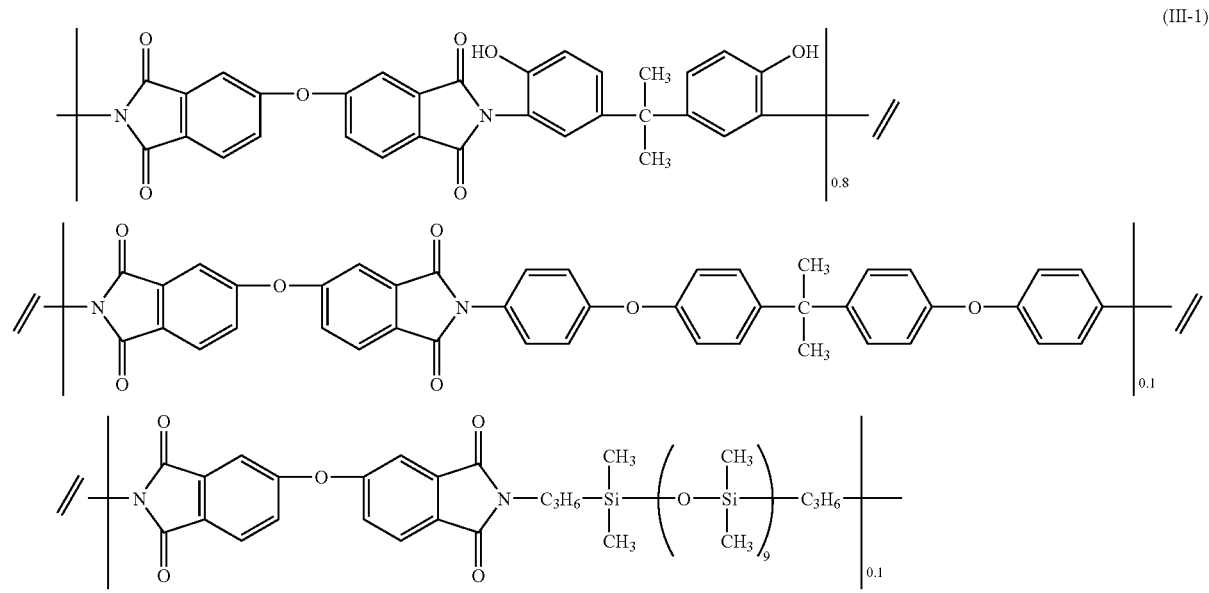

To the aforesaid resin solution, 11.2 g of glycidol was added and heated at 140° C. for 5 hours. By pouring the reaction mixture in water, 54 g of the resin represented by the following formula In a flask, 30 g of the resin (III-2) thus obtained, and 270 g of N,N-dimethylacetamide were placed, to which 5.8 g of methacryloyloxyethyl isocyanate was added dropwise at 60° C. and stirred for 1 hour. Then, 11.8 g

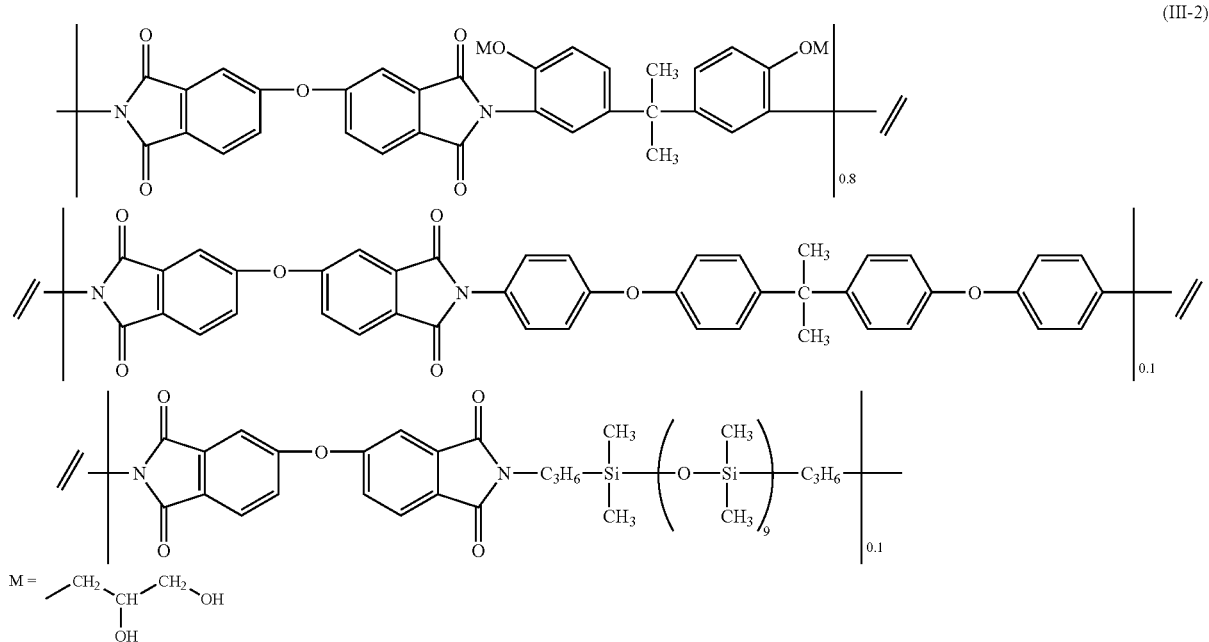

(III-2)

wherein almost all of the phenolic hydroxyl groups were reacted with glycidol was obtained. The resin had a primary alcoholic hydroxyl equivalent of 500 g/eq and a weight average molecular weight of 52,000.

of hexahydrophthalic anhydride was added and stirred for 4 hours to obtain 300 g (a solid content of 15.7%) of a solution of the polyimide resin represented by the formula (III-3).

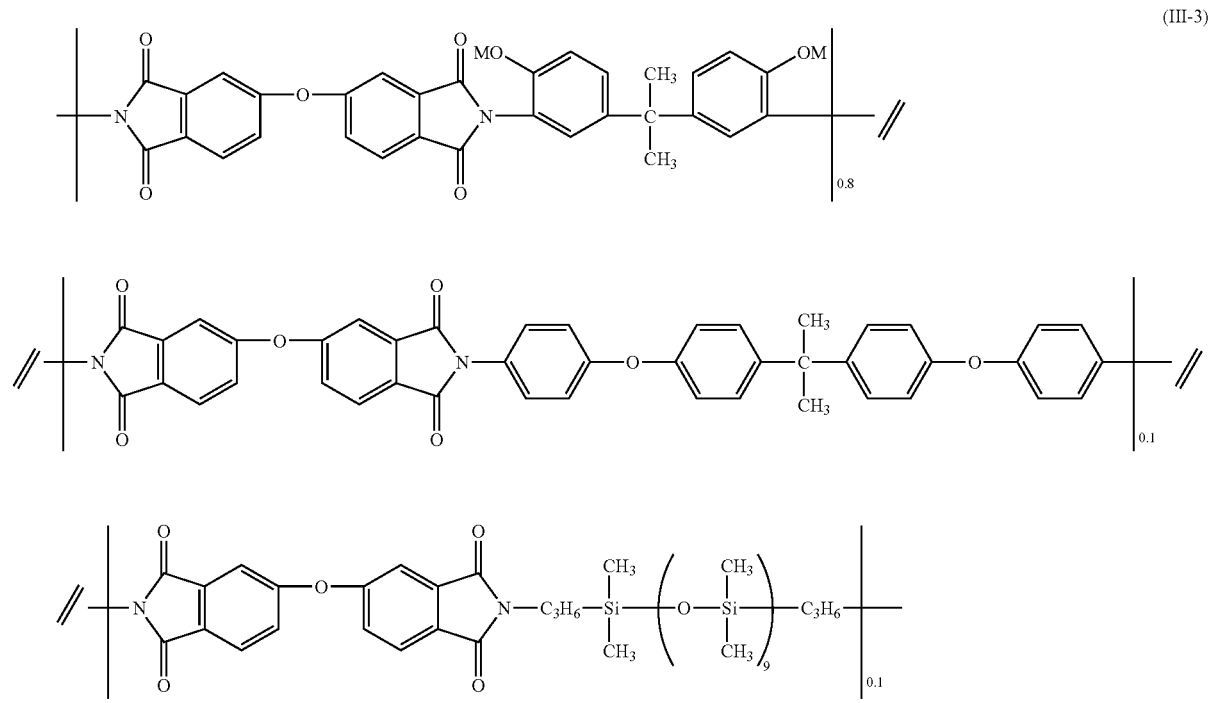

(III-3)

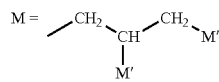

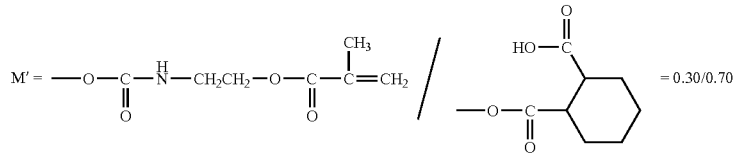

The polyimide resin had a weight average molecular weight of 81,000, an acryl equivalent of 1,300 g/eq and a carboxylic acid equivalent of 600.

Preparation Example IV

The procedures of Preparation Example III were repeated except that 5.4 g of 2-acryloyloxyethyl isocyanate sold under the trade name of Krenz AOI, ex Show Denko KK, in place of 2-meth acryloyloxyethyl isocyanate, 8.8 g of succinic acid anhydride in place of hexahydrophthalic acid anhydride were used to obtain 300 g (a solid content of 14.5%) of a solution of the polyimide resin represented by the following formula (IV-3).

The resin had a weight average molecular weight of 72,000 and an acryl equivalent of 1,200 g/eq.

Preparation Example V (Referential)

The procedures of Preparation Example I were repeated except that 10.2 g of methacryloyloxyethyl isocyanate and 2.1 g of hexahydrophthalic anhydride were reacted with 30 g of the resin of the formula (I-2) to obtain 300 g (a solid content of 13.9%) of a solution of the polyimide resin represented by the following formula (V-3).

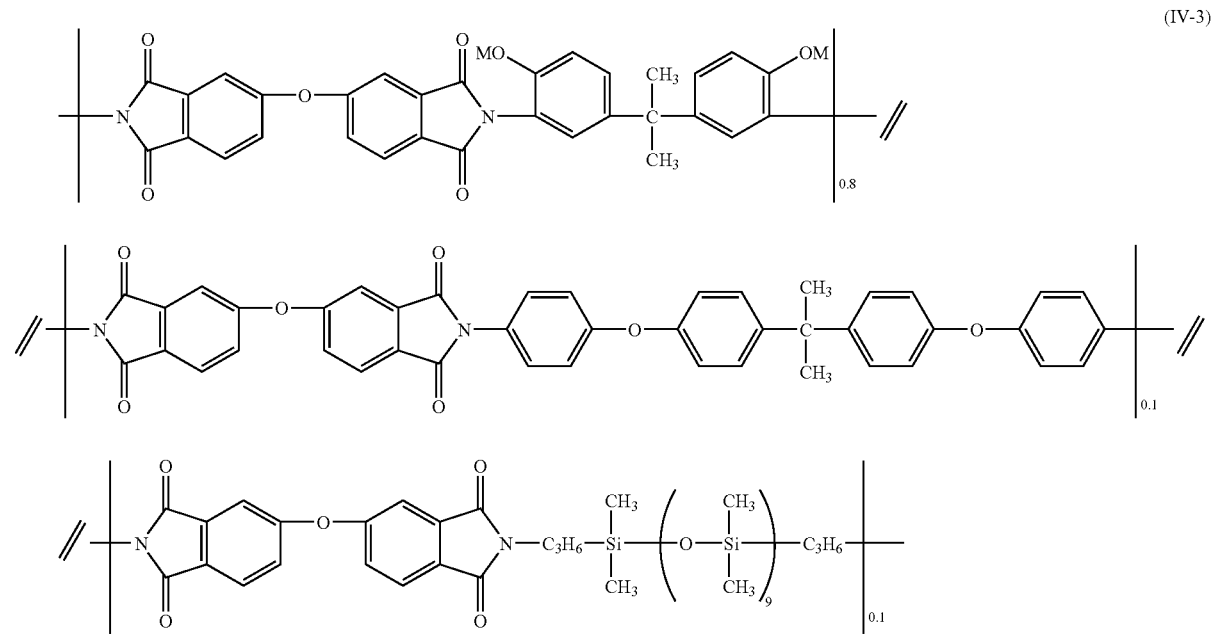

(IV-3)

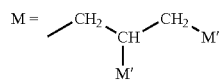

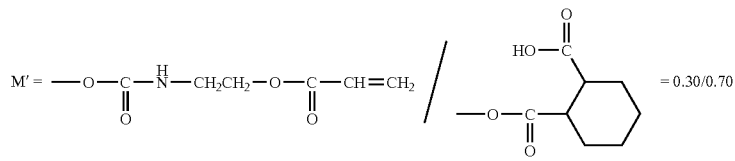

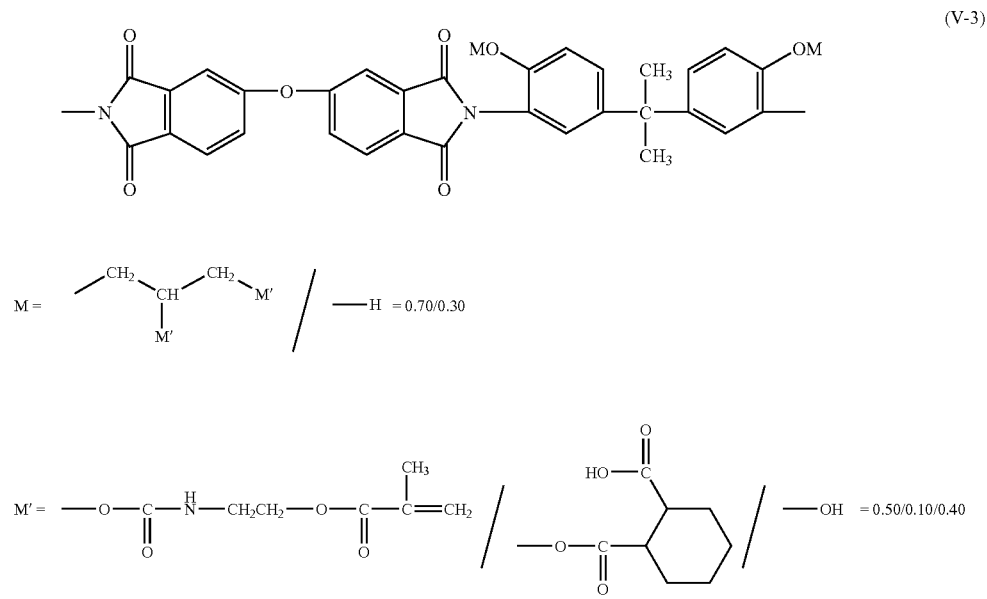

(V-3)

The polyimide resin had a weight average molecular weight of 53,000, an acryl equivalent of 640 g/eq, and a carboxylic acid equivalent of 3,100 g/eq.

Preparation Example VI (Referential)

The procedures of Preparation Example I were repeated except that 2.1 g of methacryloyloxyethyl isocyanate and 10.1 g of hexahydrophthalic anhydride were reacted with 30 g of the resin of the formula (I-2) to obtain 300 g(a solid content of 13.9%) of a solution of the polyimide resin represented by the following formula (VI-3).

The polyimide resin had a weight average molecular weight of 52,000, an acryl equivalent of 3,100 g/eq, and a carboxylic acid equivalent of 640 g/eq.

Preparation Example VII(Comparative)

According to the procedures of Preparation Example I, 200.0 g of a solution of the resin(I-1) with a solid content 17.5% was reacted with 3.3 g of glycidol and then poured in pure water. The precipitate obtained was vacuum dried, whereby 26 g of the resin represented by the following formula (VII-2) was obtained.

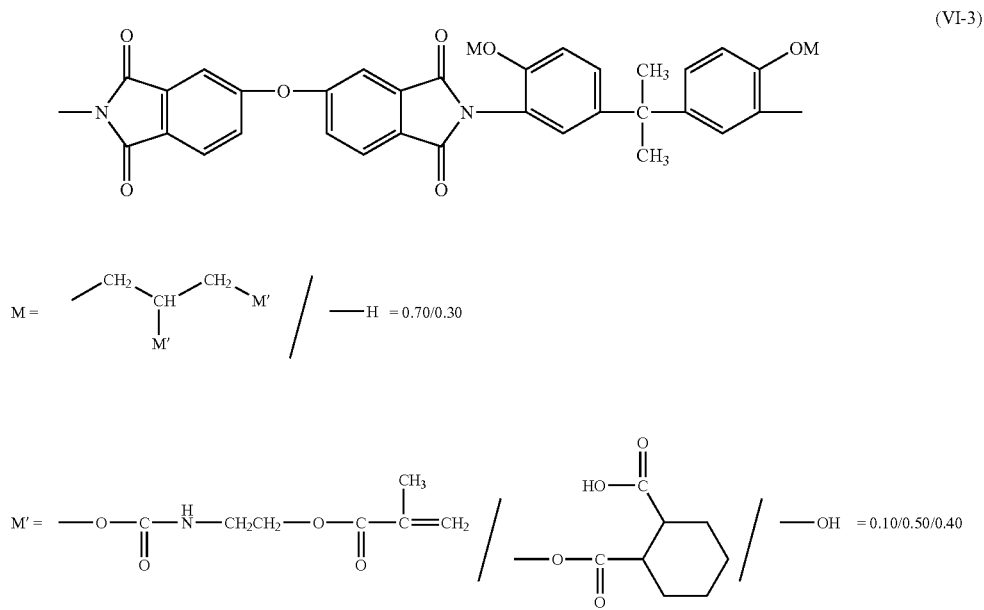

(VI-3)

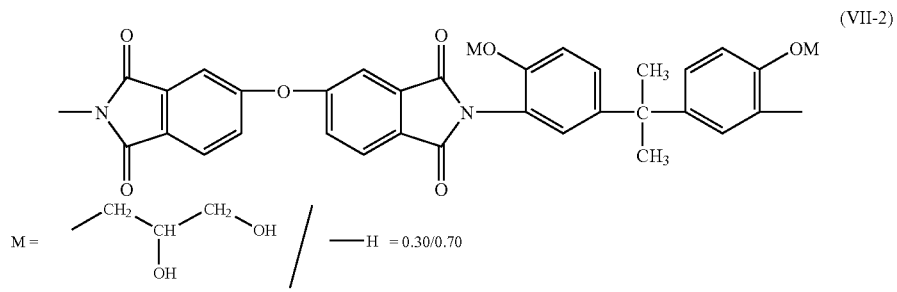

(VII-2)

The resin had a weight average molecular weight of 35,000 and a primary alcoholic hydroxyl equivalent of 1,000 g/eq.

In a flask, 20 g of the resin of the formula (VII-2) and 180 g of N,N-dimethylacetamide were placed, to which 6.6 g of methacryloyloxyethyl isocyanate was added dropwise at 60° C. After stirring for one hour, 190 g (a solid content of 13.9%) of a solution of the resin represented by the following formula (VII-3) was obtained.

described in Table 1 through a quartz photomask having striped patterns with line/space of from 10 μm to 50 μm in 1 μm increment, 5 lines for each width by using a stepper-type exposure equipment, NSR-1755i7A, ex Nikon Corp.

After the exposure, the composition layer was heated at 115° C. for 2 minutes and then cooled to room temperature. Subsequently, the substrate with the composition layer

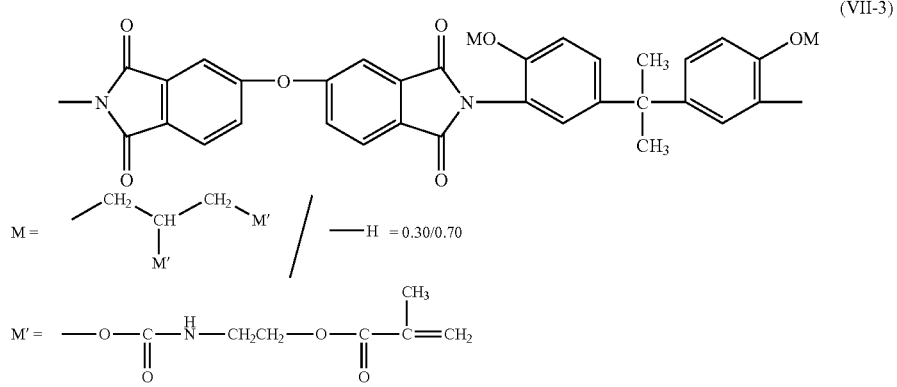

(VII-3)

The resin had a weight average molecular weight of 40,000 and an acryl equivalent of 1,300 g/eq.

B. Preparation of Photosensitive Resin Compositions (Examples 1-8, Referential Examples 1-3, Comparative Example 1)

The solution of the polyimide resin each prepared in one of the aforesaid Preparation Examples I to VII was condensed so as to make a solid content 40%, hereinafter referred to as component (A), to which component (B) and additive(s) in amount(s) in parts by weight as shown in Table 1 were added and mixed. The solution obtained was filtered with a glass filter having a pore size of 0.1 μm, whereby the photosensitive resin composition was obtained.

C. Evaluation of the Photosensitive Resin Compositions (1) Resolution of Relief Pattern Each composition was applied in a layer having a thickness as shown in Table 1 with a spin coater on two 6-inchi silicon wafers each pretreated with hexamethyldisilazane, and a 6-inchi silicon wafer plated with 2-μm thick electrolytic copper. Then, the wafers were heated on a hot plate at 115° C. for 2 minutes to evaporate the solvent.

Then, the layer of the composition on one of the silicon wafers was exposed to 365-nm light with the exposure thereon was subjected to development with 1% aqueous solution of sodium carbonate using a spray developing machine for the period of time described in Table 1. A minimum line width resolved and a thickness of the layer after development are also shown in Table 1. The line width was observed with a microscope, and the thickness was measured after removing water by heating the developed pattern at 90° C. for 30 sec.

(2) Evaluation of Cured Layer

The composition layer on the second silicon wafer and the copper plated wafer were exposed and subjected to the development in the same manner as described above except that the whole area was exposed to the light, and the development was performed for 10 minutes. Next, the developed layer was heated in an oven at 220° C. for 1 hour. The cured layer obtained was evaluated in terms of adhesion strength and electric insulation property. The results are as shown in Table 2. The adhesion strength of the cured layer was evaluated by placing the cured layer in a pressure cooker at 2 atmospheric pressure (121° C./100% RH) for 24 hours, and then subjecting to a cross-cut peel test. The electric insulation property was evaluated by an electrical breakdown test according to the Japanese Industrial Standards (JIS) C2103.

TABLE 1

| | Components of the Composition, parts by weight | | | Coating thickness | Exposure | Time for development | Developed thickness | Resolution |
|---|---|---|---|---|---|---|---|---|
| | (A) | (B) | Additive(s) | | | | | |
| Example 1 | I-3; 100 | a); 3 b); 2 d); 0.5 | e); 0.1 | 14 μm | 1000 mJ | 3 min | 12 μm | 20 μm line |
| Example 2 | II-3; 100 | a); 3 d); 0.5 | e); 0.1 g); 0.1 | 15 μm | 1000 mJ | 3 min | 12 μm | 20 μm line |
| Example 3 | III-3; 100 | a); 3 b); 2 d); 0.5 | e); 0.1 | 14 μm | 1000 mJ | 7 min | 13 μm | 20 μm line |
| Example 4 | IV-3; 100 | a); 2 b); 1 d); 0.2 | e); 0.1 | 14 μm | 1000 mJ | 5 min | 13 μm | 20 μm line |
| Example 5 | I-3; 100 | a); 3 b); 2 d); 0.5 | e); 0.1 f); 5 | 14 μm | 1000 mJ | 4 min | 12 μm | 20 μm line |
| Example 6 | IV-3; 100 | a); 3 b); 1 d); 0.5 | e); 0.1 f); 5 g); 2 | 14 μm | 1000 mJ | 7 min | 13 μm | 20 μm line |
| Example 7 | II-3; 100 | a); 3 b); 2 d); 0.5 | e); 0.1 f); 3 g); 2 | 15 μm | 1000 mJ | 5 min | 12 μm | 20 μm line |
| Example 8 | II-3; 100 | a); 1 c); 1 d); 0.5 | e); 0.1 g); 0.1 | 15 μm | 1000 mJ | 3 min | 12 μm | 20 μm line |
| Referential Example 1 | V-3; 100 | a); 3 b); 1 d); 0.5 | e); 0.1 | 13 μm | 1000 mJ | 20 min | Insoluble in developer | |
| Referential Example 2 | VI-3; 100 | a); 3 b); 2 d); 0.5 | e); 0.1 g); 0.1 | 14 μm | 1000 mJ | 3 min | dissolved away | |
| Referential Example 3 | VI-3; 100 | a); 3 b); 2 d); 0.5 | e); 0.1 f); 5 g); 2 | 14 μm | 1200 mJ | 4 min | dissolved away | |
| Comparative Example 1 | VII-3; 100 | a); 2 b); 1 d); 0.2 | e); 0.1 | 15 μm | 1000 mJ | 20 min | Insoluble in developer | | a) 2,2'-bis(o-chlorophenyl)-4',5'-tetraphenyl-1'-biimidazole
b) Ethyl 4-diethylaminobenzate
c) N-phenylglycine
d) 2,4-diethylthioxanthone
e) X-70-093, a fluorinated silicone surfactant, ex Shin-Etsu Chemical Co., Ltd.
f) R-604, a multi-functional acrylate, ex Nippon Kayaku Co.
g) KBE-403, an epoxy-modified alkoxy silane adhesive aid, ex Shin-Etsu Chemical Co., Ltd.

TABLE 2

| | Adhesion strength | | Electrical property Breakdown Insulation breakdown |
|---|---|---|---|
| Example | Silicon wafer | Copper plated substrate | |
| 1 | 0/100 | 0/100 | 300 V/μm |
| 2 | 0/100 | 0/100 | 300 V/μm |
| 3 | 0/100 | 0/100 | 250 V/μm |
| 4 | 0/100 | 0/100 | 250 V/μm |
| 5 | 0/100 | 0/100 | 300 V/μm |
| 6 | 0/100 | 0/100 | 250 V/μm |
| 7 | 0/100 | 0/100 | 300 V/μm |
| 8 | 0/100 | 0/100 | 300 V/μm |

The composition of Comparative Example 1 without a carboxylic group could not form a relief pattern. The composition of Referential Example 1 contained carboxylic group in an amount too low to dissolve in the developing liquid. The compositions of Referential Examples 2 and 3 contained much carboxyl groups and little acryl groups, so that entire composition dissolved in the developing liquid.

In contrast, the present compositions of Examples 1 to 8 formed clear relief patterns even with a weak alkaline developer solution such as sodium carbonate solution, indicating good processability as a photosensitive material. The cured layer of the composition showed good adhesion to the substrates and electric insulation property.

The invention claimed is:

1. A polyimide resin, characterized in that the polyimide resin comprises three kinds of repeating units represented by the formula (1), and has a weight average molecular weight, reduced to polystyrene, of from 5,000 to 500,000, an acryl equivalent of from 400 to 3,000 g/eq, and a carboxylic acid equivalent of from 300 to 2500 g/eq (1)

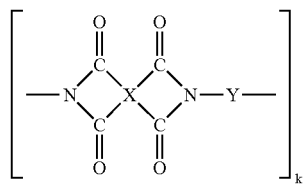

-continued

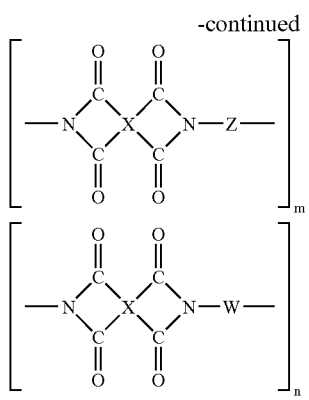

wherein X is a tetravalent organic group, Y is represented by the following formula (3)

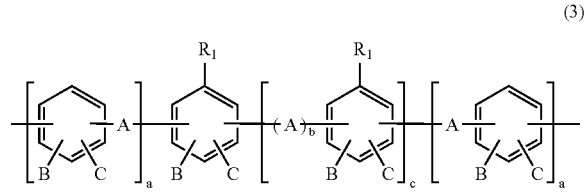

wherein A may be the same with or different from each other and is a divalent organic group selected from the following groups

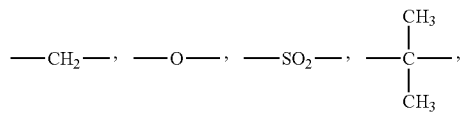

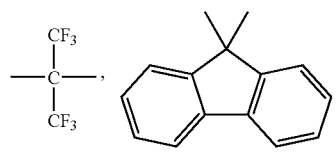

B and C may be the same with or different from each other and are $C_{1-4}$ alkyl groups, alkoxy groups or hydrogen atoms, a and b each are 0 and 1, and c is an integer of from 0 to 10, $R^1$ may be the same with or different from each other and is selected from the following groups

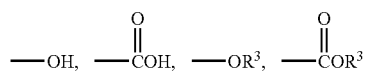

at least one of $R^1$ is selected from the following group,

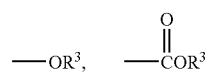

wherein $R^3$ is represented by the following formula
$$-R^4(OR^3)_2$$
wherein $R^4$ is a $C_{3-6}$ trivalent hydrocarbon group, and $R^3$ may be different from each other and is selected from the group consisting of a hydrogen atom, a residue of $C_{6-14}$ (meth)acryloyloxy isocyanate induced through a reaction of an isocyanate group of the $C_{6-14}$ (meth)acryloyloxy isocyanate with an alcoholic hydroxyl group of $-R^4OH$, and a residue of a $C_{4-14}$ acid anhydride induced through a reaction of an anhydride group of the $C_{4-14}$ acid anhydride with an alcoholic hydroxyl group of $-R^4OH$, Z is a divalent organic group which does not have any of (meth)acryl, carboxyl, and hydroxyl groups, W is a divalent organic group having a polyorganosiloxane structure, and X, Y, Z and W each may be a mixture of two or more groups, k is a number of from 0.2 to 1.0, m is a number of from 0 to 0.8, and n is a number of from 0 to 0.8, with k+m+n being 1.

2. The polyimide resin according claim 1, wherein the polyimide resin has an acryl equivalent of from 400 to 2,000 g/eq, and a carboxylic acid equivalent of from 300 to 1,500 g/eq.

3. The polyimide resin according to claim 1, wherein $R^a$ is at least one selected from the following groups

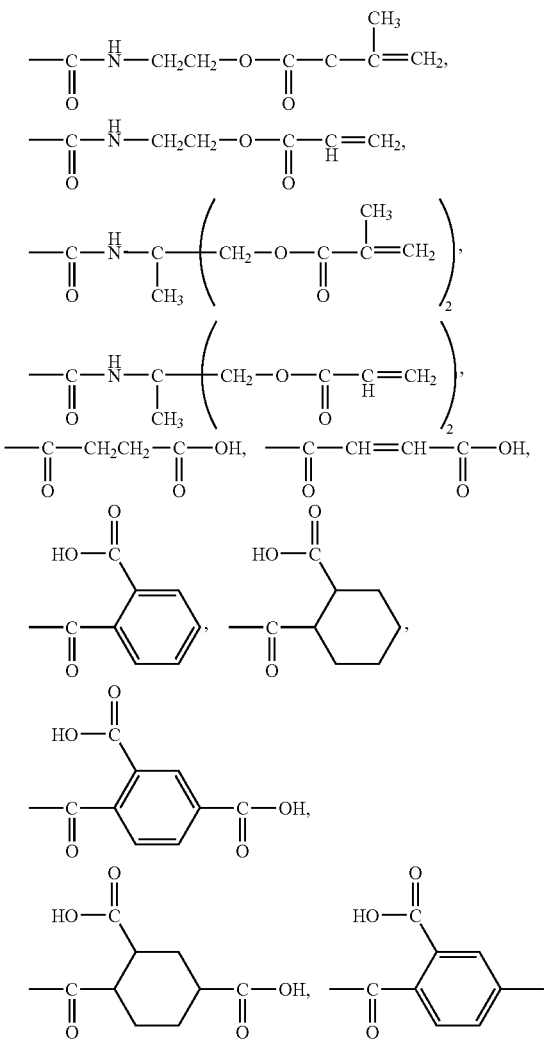

-continued

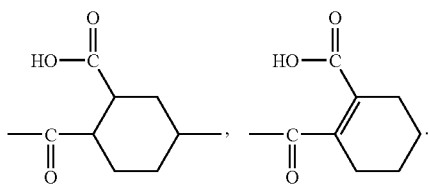

4. The polyimide resin according to claim 1, wherein $R^3$ is selected from the following groups

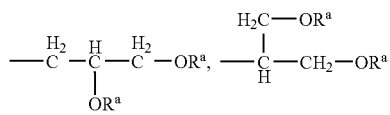

wherein each bond is bound to an oxygen atom.

5. The polyimide resin according to claim 1, wherein X is at least one selected from the following groups

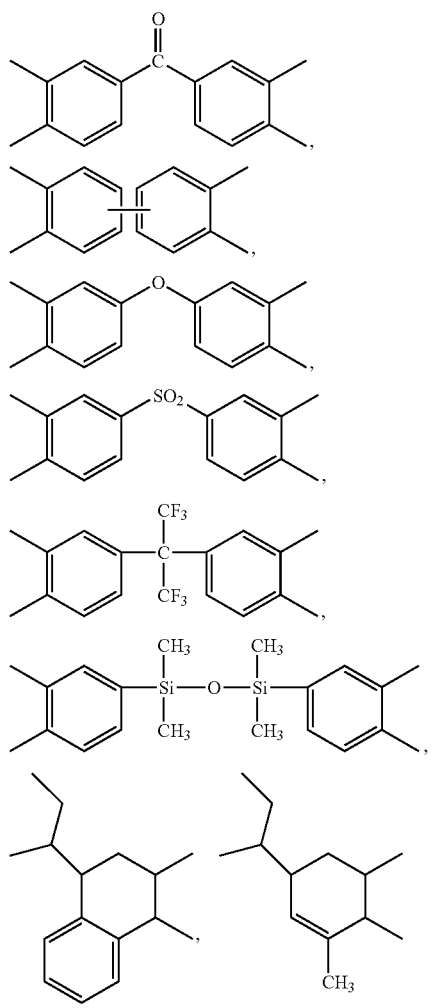

Z is a divalent organic group represented by the following formula (4)

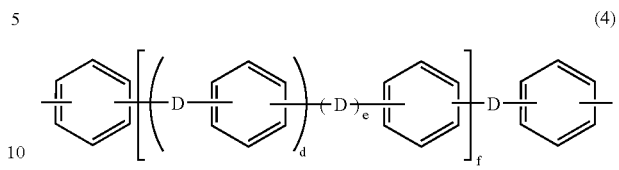

(4)

wherein D may be the same with or different from each other and is a divalent organic group selected from the following groups

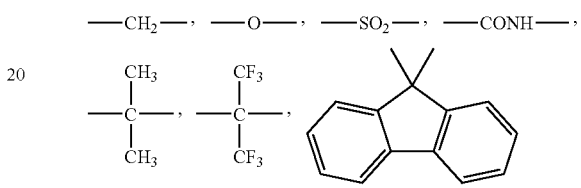

and d, e and f each are 0 or 1, and

W is a divalent organic group having a polyorganosiloxane structure represented by the following formula (5).

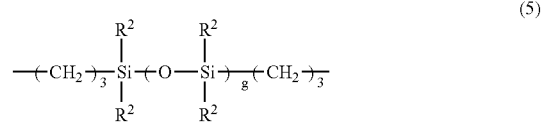

(5)

wherein $R^2$ may be the same with and different from each other and is a $C_{1-8}$ monovalent hydrocarbon group, and g is an integer of from 1 to 80.

6. A photosensitive resin composition comprising
(A) the polyimide resin according to claim 1, and
(B) a photopolymerization initiator and/or photosensitizer in an amount of from 0.1 to 20 parts by weight per total 100 parts by weight of the components (A) and (B).

7. The photosensitive resin composition according to claim 6, wherein the composition further comprises (C) at least one organic solvent selected form the group consisting of esters, ethers, alcohols, ketones, and amides in an amount of from 50 to 2,000 parts by weight per total 100 parts by weight of the components (A) and (B).

8. A method of preparing a patterned layer, comprising the steps of
(i) applying the photosensitive resin composition according to claim 6 on a substrate to form a layer of the photosensitive resin composition,
(ii) exposing the layer of the photosensitive resin composition to a light having a wavelength of from 240 to 500 nm through a photomask having a pattern, and
(iii) developing a patterned layer of the photosensitive resin composition with a developing liquid.

9. The method according to claim 8, wherein the method further comprises the step of heating the layer of the photosensitive resin composition between the steps (ii) and (iii).

10. The method according to claim 8, wherein the method further comprises the step of (iv) heating the patterned layer after the step (iii).

11. A method of preparing a protective layer, comprising the steps of
(i) applying the photosensitive resin composition according to claim 6 to a surface to be protected to form a layer of the photosensitive resin composition,
(ii) exposing the layer of the photosensitive resin composition to a light having a wavelength of from 240 to 500 nm, and
(iii) post-curing the layer of the photosensitive resin composition at a temperature of from 120 to 300° C.

* * * * *